(12) United States Patent
de Jong et al.

(10) Patent No.: US 10,184,586 B2
(45) Date of Patent: Jan. 22, 2019

(54) SELF-ENERGIZING SEALING MECHANISMS

(71) Applicant: Apple Inc., Cupertino, CA (US)

(72) Inventors: Erik G. de Jong, San Francisco, CA (US); Brad G. Boozer, Saratoga, CA (US); William C. Lukens, San Francisco, CA (US); David M. Pelletier, Cupertino, CA (US); Eugene Fox, San Jose, CA (US)

(73) Assignee: Apple Inc., Cupertino, CA (US)

( * ) Notice: Subject to any disclaimer, the term of this patent is extended or adjusted under 35 U.S.C. 154(b) by 144 days.

(21) Appl. No.: 15/206,156

(22) Filed: Jul. 8, 2016

(65) Prior Publication Data

US 2017/0086321 A1    Mar. 23, 2017

Related U.S. Application Data

(60) Provisional application No. 62/222,743, filed on Sep. 23, 2015.

(51) Int. Cl.
*F16K 31/126* (2006.01)
*H05K 5/02* (2006.01)
*F16K 24/00* (2006.01)
*F16K 99/00* (2006.01)
*G06F 1/16* (2006.01)

(52) U.S. Cl.
CPC ............ *F16K 31/126* (2013.01); *F16K 24/00* (2013.01); *H05K 5/0213* (2013.01); *F16K 99/0055* (2013.01); *G06F 1/163* (2013.01)

(58) Field of Classification Search
CPC .... F16K 31/12; F16K 31/126; F16K 31/1262; F16K 24/00; F16K 99/0015; F16K 99/0025; F16K 99/0055; H05K 5/0213; G06F 1/163
USPC .................................................. 361/689.03
See application file for complete search history.

(56) References Cited

U.S. PATENT DOCUMENTS

| 4,262,062 | A | * | 4/1981 | Zatsky | .................. | G04C 10/00 |
| | | | | | | 429/110 |
| 4,853,722 | A | | 8/1989 | Gell, Jr. | | |
| 5,258,592 | A | | 11/1993 | Nishikawa et al. | | |
| 9,964,224 | B2 | * | 5/2018 | Germiquet | ................ | F16K 1/16 |

(Continued)

*Primary Examiner* — Ian Paquette
(74) *Attorney, Agent, or Firm* — Dickinson Wright RLLP (57) ABSTRACT

An electronic device having an interior volume, the electronic device including a sealing mechanism to prevent ingress of water into the interior cavity. The sealing mechanism having a channel having a first opening at an external environment and a second opening that leads to the interior volume, a membrane that covers the second opening, the membrane being air permeable and water resistant such that the membrane allows air to pass and prevents passage of water up to an upper pressure threshold, a stopper mechanism, and a diaphragm comprising a surface arranged to receive an external water pressure and that is air and water impermeable, the diaphragm being coupled to the stopper mechanism that deflects in response to the water pressure such that the diaphragm actuates the stopper mechanism and seals off the channel from at the first opening preventing water pressure at the membrane from exceeding the upper pressure threshold.

18 Claims, 11 Drawing Sheets

(56) References Cited

U.S. PATENT DOCUMENTS

2014/0294217 A1 10/2014 Yamaguchi et al.
2016/0309604 A1* 10/2016 Steijner .................... E06B 7/22

* cited by examiner

SELF-ENERGIZING SEALING MECHANISMS

CROSS-REFERENCE TO RELATED APPLICATIONS

The present application claims the benefit of U.S. Provisional Application No. 62/222,743, entitled "SELF-ENERGIZING SEALING MECHANISMS" filed Sep. 23, 2015, the content of which is incorporated herein by reference in its entirety for all purposes.

FIELD

The following disclosure relates to an electronic device. In particular, the following disclosure relates to electronic devices that can be subjected to environments having high moisture and/or water, and mechanisms for preventing the intrusion of water into the electronic device.

BACKGROUND

Electronic devices may include certain features to enhance a user experience as well as for preventing harm to the internal components of electronic devices in high water content environments. As electronic devices become more ubiquitous, it is beneficial to be able to use them in various environments without damaging the device, including when water is present.

SUMMARY

An electronic device is described. Some embodiments include an electronic device having a housing having walls that define an interior volume, the electronic device including a sealing mechanism arranged to prevent ingress of water into the interior cavity. The sealing mechanism can include a channel having a first opening at an external environment and a second opening that leads to the interior volume. The sealing mechanism can further include a membrane that covers the second opening, the membrane being air permeable and water resistant such that the membrane allows air to pass and prevents passage of water up to an upper pressure threshold. The sealing mechanism can further include a stopper mechanism and a diaphragm comprising a surface arranged to receive an external water pressure and that is air and water impermeable, the diaphragm being coupled to the stopper mechanism wherein the diaphragm deflects a first distance in response to the water pressure such that the diaphragm actuates the stopper mechanism and seals off the channel from the external environment at the first opening preventing water pressure at the membrane from exceeding the upper pressure threshold.

Some embodiments can include a method performed by a sealing mechanism for preventing ingress of water into an interior volume of a housing, wherein the sealing mechanism can include a channel having a first opening at an external environment and a second opening that leads to the interior volume. The sealing mechanism can further include a membrane that covers the second opening, the membrane being air permeable and water resistant up to an upper pressure threshold such that the membrane allows air to pass and prevents passage of water. The sealing mechanism can further include a stopper mechanism and a diaphragm that is air and water impermeable and coupled to the stopper mechanism. The method can include receiving a water pressure at the diaphragm, deflecting the diaphragm in response to the water pressure received, and closing the channel at the first surface opening in accordance with the deflection of the diaphragm, wherein a pressure at the membrane is maintained less than the pressure threshold.

In some embodiments the stopper mechanism can include a piston having a piston head and a gasket, the piston being coupled to the diaphragm, the gasket being arranged to a top side of the piston, opposite where the piston couples with the diaphragm and wherein the gasket cantilevers over the first opening. In some embodiments the stopper mechanism can include a piston having a piston head and a gasket, the piston being coupled to the diaphragm and the gasket being arranged to the bottom side of the piston head, and wherein the channel is inclined such that the first opening is below the gasket.

In some embodiments the stopper mechanism also seals off the diaphragm from the external environment. In some embodiments the membrane is integrated into the diaphragm. In some embodiments the diaphragm is biased to actuate the stopping mechanism open when the external water pressure drops below a lower threshold. In some embodiments the membrane is made from expanded polytetrafluoroethylene "ePTFE". In some embodiments the diaphragm is convoluted. In some embodiments the electronic device is a wearable. In some embodiments the sealing mechanism is modular.

In some embodiments the stopper mechanism comprises a cantilevered gasket that extends over the first opening. In some embodiments the stopper mechanism comprises a piston having a piston head and a gasket, the piston being coupled to the diaphragm and the gasket being arranged to the bottom side of the piston head, and wherein the opening is arranged below the gasket. In some embodiments the diaphragm is arranged in the channel. In some embodiments the diaphragm actuates the stopping mechanism open when the external water pressure drops below a lower threshold. In some embodiments the diaphragm is convoluted.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to sealing mechanisms for electronic devices using membranes. In particular, the sealing mechanism can be used in electronic devices that can have a form factor that renders the electronic device mobile and/or wearable. By wearable, it is meant that a user can wear the electronic device as a decorative (but also functional) accessory that can be secured or otherwise attached to a garment or appended to a user's limb much like a watch. In the context of this discussion, however, the electronic device can be considered an accessory that can be carried or worn by the user. In this way, the electronic device can act both as an adornment as well as a source of useful information. The information can be provided real time and can be associated with a current physical state of the user and/or information regarding an external environment that the user would find of interest. For example, the electronic device can be worn as a bracelet or a watch that can be taken along on various athletic endeavors such as rock climbing, skydiving, surfing, jogging etc. In this way, the electronic device can be used to monitor (and record if need be) external conditions such as temperature, pressure, light conditions, speed, distance and so on. By mobile it is meant the electronic device that can easily be carried by a user. Mobile electronic devices can provide much of the same information as wearable's, and sometimes more.

Mobile electronic devices, such as smartphones, and wearables, such as an electronic watch, are used in a variety of circumstances and conditions that can expose the electronic device to water or moisture For example, simply washing dishes or one's hands can expose the wearable device to soapy water (which can have undesirable effects) whereas in other situations (such as swimming or diving), exposure to water can be beneficial and desirable (detecting water temperature, for example). In any case, it is important that regardless of the reason(s) for the exposure to water, that the integrity of the interior of the electronic device be maintained.

To prevent water intrusion, an electronic device may include seals. That said, electronic devices must also be able to "breathe," or vent air from the internal portions of the electronic device for various reasons such as maintaining pressure differentials between the interior and exterior of the electronic device housing. Venting also allows for operation of components such as microphones and speakers.

Some water-resistant seals allow air to permeate a membrane, but prevent water from passing through the membrane. Even still, when pressure increases or if water impurities are introduced, such as soap of other surfactants, these membranes do not perform as well and can allow water to permeate the membrane. In particular, expanded polytetrafluoroethylene ("ePTFE") membranes often can be used as a way to allow airflow and block water, but these membranes lose their water resisting ability when external water is highly pressurized or the water has surfactant chemicals such as soap.

Accordingly, some embodiments of sealing mechanisms for preventing the intrusion of water can include a vent in the electronic device that can be covered by an air permeable water-resistant membrane (hereinafter "membrane"), such as ePTFE, that prevents water from entering the enclosure via the vent, but allows air to permeate the membrane. However, the ability of the membrane to prevent water intrusion can be degraded by higher pressures and exposure to surfactants such as soap that can reduce a surface tension of the water. Since surface tension of the water prevents water from passing through the mesh's pores, a reduction of the surface tension can allow passage of at least some of the water molecules through the mesh. Initially, the membrane can still resist permeation of soapy water, but as the pressure increases, the ability to resist this permeation decreases, since the surface tension is decreased or higher pressure. Thus, additional mechanisms are needed to ensure that water does not enter the enclosure after being exposed to such surfactants.

Accordingly, a sealing mechanisms can be used utilizing a membrane (hereinafter "membrane") spanning a vent in conjunction with a diaphragm and stopping mechanism. The diaphragm can biases the stopping mechanism, which can take the form of a gasket, to seal off the vent. In some embodiments the diaphragm can be connected with a piston. The piston can be arranged in an opening in the sealing mechanism enclosure. The piston can be connected to a vent gasket such that increased pressure on the diaphragm, from being submerged in water, for example, can cause the diaphragm to change shape in a flexing motion. In this way, the flexing of the diaphragm can cause the piston to push the vent gasket into a position to seal off the vent such that additional water does not enter the vent. In some embodiments the vent gasket can be static and a piston can be actuated against the vent gasket by the increasing pressure to seal off the vent. In some embodiments, the vent and diaphragm can be configured such that when the diaphragm flexes, both the diaphragm and the membrane are sealed off from the exterior environment. Sealing off both the membrane and the diaphragm not only prevents additional water from entering the vent, but it also prevents additional pressure from building up on the membrane. In this way, the membrane can still be effective in resisting permeation of the low-pressure soapy water, but additional pressure build up is prevented, thus avoiding potentially overloading the membrane. This can be advantageous since overloading the membrane can cause it to strain, tear or even stretch to a degree that water can permeate the mesh pores of the membrane.

In other words as the pressure increases, the pressurized liquid on the outside of the diaphragm and the ambient pressure inside create a pressure differential, which causes the diaphragm to deflect towards the interior. The membrane is still able to resist the pressure. However, as the diaphragm deflects further, the nominally open vent gasket closes and makes a self-energizing seal before water pressure reaches the critical pressure at which the membrane would have failed. Once the vent gasket is closed, the gasket resists ingress of water and offloads the membrane from having to resist high pressures.

When pressure is lowered, for instance when the electronic device is removed from water and returned to the ambient air pressure, the diaphragm can retract, or relax, causing the vent gasket to retract away from the vent. This allows air to once again travel into and out of the enclosure via the vent and membrane.

In some embodiments, the diaphragm can be biased so that the vent gasket does not cover the vent except when the mechanism is subjected to a threshold pressure. In some embodiments the vent gasket can be integrated into the piston. In some embodiments, the vent can be configured to be located near the piston and diaphragm such that when the diaphragm deflects and the piston moves the vent gasket is pressed up against the vent, sealing it off from the exterior environment. In some embodiments the membrane can act as the diaphragm itself.

The embodiments shown and described relate to an electronic device. The electronic device can take the form of a mobile electronic device and/or a wearable electronic device that can be attached to a garment worn by a user or carried with respect to an appendage (such as a wrist) of the user. These and other embodiments are discussed below with reference to FIGS. 1-12. However, those skilled in the art will readily appreciate that the detailed description given herein with respect to these Figures is for explanatory purposes only and should not be construed as limiting.

Figure 1:
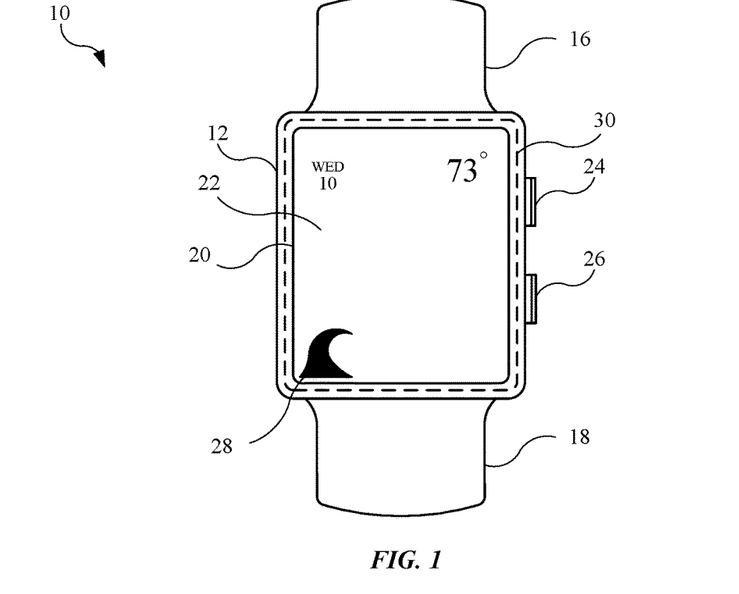
FIG. 1 shows a front view of an embodiment of an electronic device, in accordance with the described embodiments.

FIG. 1 illustrates a front view of an embodiment of an electronic device 10, in accordance with the described embodiments. In some embodiments, the electronic device 10 is a mobile communication device, such as a smart phone. In other embodiments, the electronic device 10 is a wearable computing device. In the embodiment shown in FIG. 1, the electronic device 10 is a wearable electronic device designed to secure with an appendage (for example, an arm or a leg) of a user of the electronic device 10.

Electronic device 10 may include a housing 12 formed from a rigid material, such as a metal (including stainless steel or aluminum). Housing 12 may be coupled with a first band feature 16 and a second band feature 18, with the first band feature 16 and the second band feature 18 are designed to secure the electronic device 10 with an appendage of a user. Also, the electronic device 10 may include a display module 20 designed to display visual content, including a day and a time of the day, etc. In some embodiments, the display module 20 is a light-emitting diode ("LED") display. Further, in some embodiments, the display module 20 is an organic light-emitting diode ("OLED") display. The display module 20 may further include a cover glass 22 disposed over the display module 20. In addition to displaying time, the display module 20 may also display visual content based upon applications, or "apps," stored on a memory circuit (not shown) disposed between the housing 12 and the display module 20. For example, icon 28 can be used to indicate a particular activity (in this case a wave can indicate aquatic activity such as surfing). Seal 30 can provide a good environmental seal isolating an interior of electronic device 10 from an external environment. Seal 30 can take the form of membranes, O-rings, tape, or other similar sealing materials. In this way, the interior of electronic device 10 can act as an environmental reference datum. Also, the electronic device 10 may pair, via wireless communication, with an additional electronic device (not shown), such as a smart phone.

Electronic device 10 may include several input features electrically coupled with one or more processors (not shown), and designed to control the display module 20. For example, electronic device 10 can include a first control input 24 and a second control input 26, each of which may be partially disposed in openings of housing 12. The first control input 24 may take the form of a dial design for clockwise and counter-clockwise rotation, with the rotation used to control the display module 20. Further, the first control input 24 may be depressed to define a further control input feature. The second control input 26 may take the form of a button that provides an additional control input feature when depressed. Although not shown, the first control input 24 and/or second control input 26 may be disposed in other locations of the housing 12. Also, the electronic device 10 may include more or fewer control inputs in other embodiments. Further, the electronic device 10 may include a touch sensor (not shown) disposed behind (and in some cases integrated) with the display module 20. This allows the user to further control the display module 20 by depressing the cover glass 22 triggering the touch sensor to generate a control input and alter the visual content of the display module 20.

Figure 2:
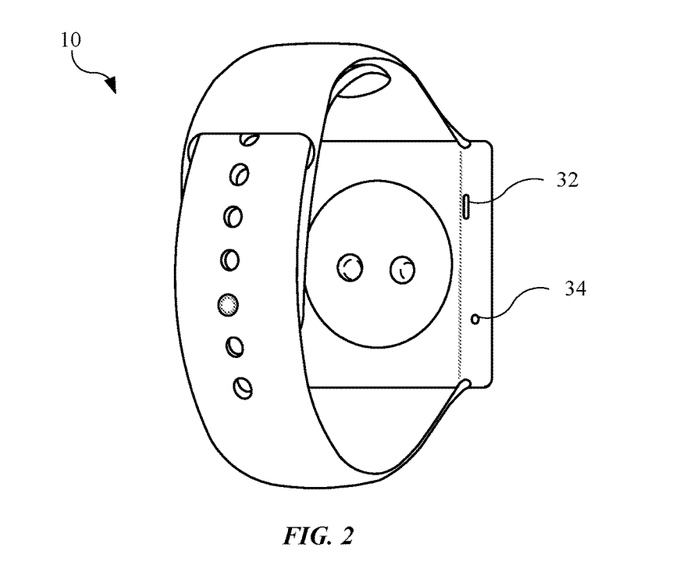
FIG. 2 shows a rear view of the electronic device shown in FIG. 1, showing several openings in the housing.

FIG. 2 illustrates a rear view of the electronic device shown in FIG. 1, showing several openings in the housing 12. As shown, the first band feature 16 is engaged with the second band feature 18 to define a closed configuration allowing the electronic device 10 to be secured with an appendage of a user. The electronic device 10 may include a first opening 32 in the housing 12 that may allow, for example, an output of audible sound from a speaker module (not shown) disposed in the housing 12. Also, the electronic device 10 may include a second opening 34 in the housing 12 that may allow, for example, an input of audible sound to a microphone (not shown) disposed in the housing 12. Although the first opening 32 and the second opening 34 are shown in distinct locations, the first opening 32 and the second opening 34 may vary in location along the housing 12, and further, may vary in size and shape. Further, the number of openings may vary according to the functionality of the electronic device 10. For example, an additional opening (not shown) may be used in conjunction with the first opening 32 to enhance the audible sound. While seal 30 provides a good seal for interior components of electronic device 10 from the external environment, openings such as openings 32 and 34 provide water intrusion points. That said, proper operation of the microphone or audio for instance require openings in housing 12 to allow air that transmits sound to pass through housing 12. The systems described in various embodiments herein can be used in conjunction with openings like openings 32 and 34 to allow proper operation of internal components while preventing water from entering housing 12, when electronic device 10 is subject to a water or a water environment.

Figure 3A:
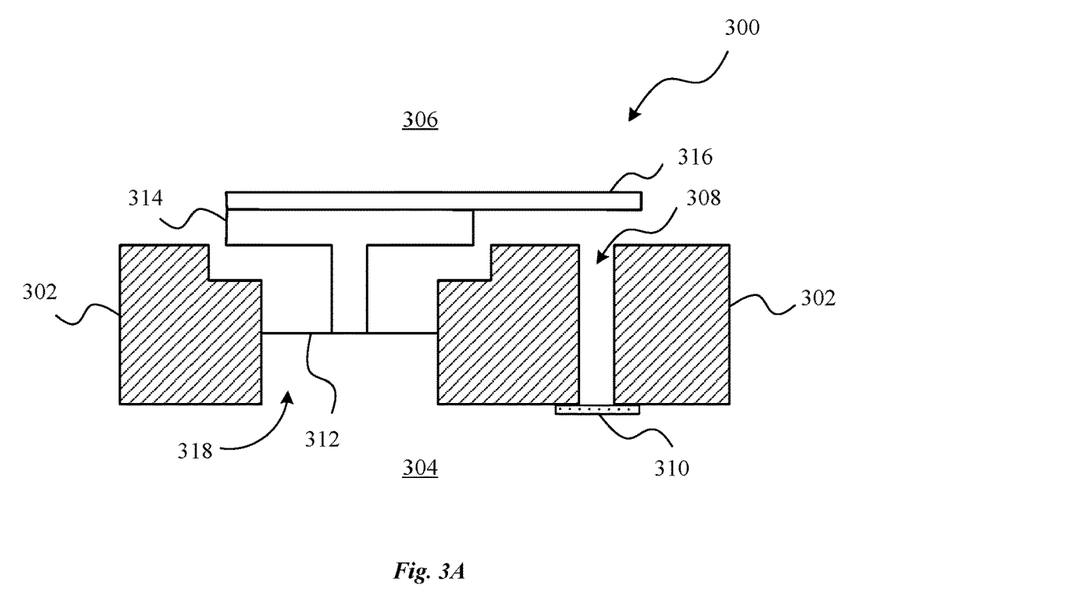
FIGS. 3A and 3B show a representation of one embodiment of a sealing mechanism in accordance with the described embodiments.
Figure 3B:
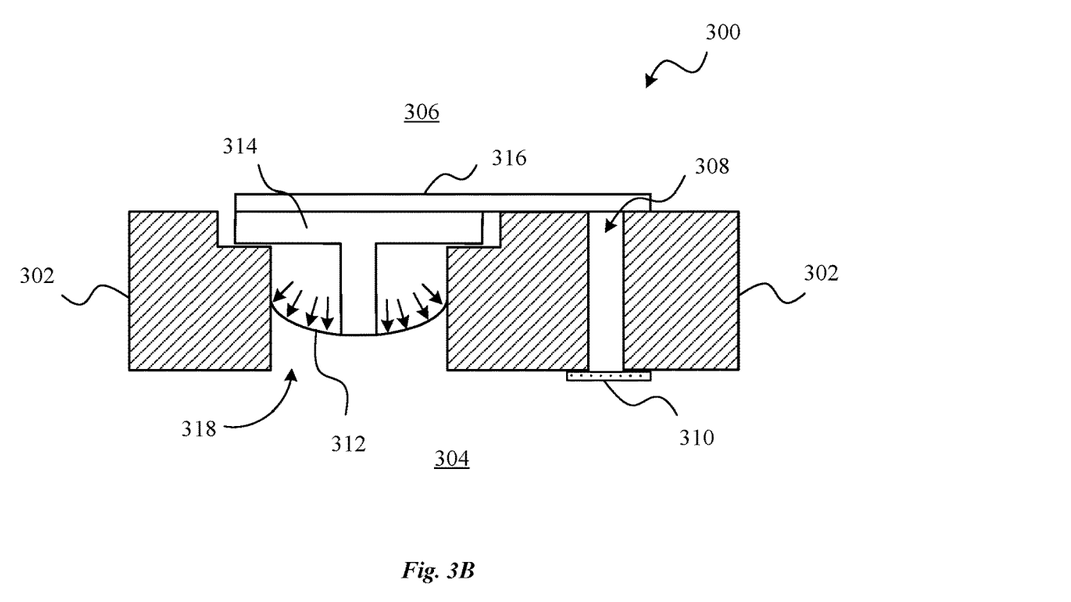

FIGS. 3A and 3B show a representation of a sealing mechanism 300 in accordance with the described embodiments. Sealing mechanism 300 can include an enclosure 302 with an interior side 304 and an exterior side 306. The enclosure 302 can be integrated into the housing 12 or it can be sub-enclosure to can be installed within the interior of the housing 12. The enclosure 302 can have a vent 308 for allowing air to flow in and/or out of enclosure 302. The vent 308 can be a single opening, as shown, or can be multiple openings in the enclosure 302. A membrane 310 can span the vent 308. In the case of one or more openings forming vent 308 the membrane 310 can span all the openings. Alternatively several membranes can span each opening. The membrane 310 can be made of an expanded polytetrafluoroethylene ("ePTFE"). The membrane 310 can allow air, but resist water, from permeating the membrane 310. In some embodiments, a diaphragm opening 318 can be arranged near vent 308 and be configured to extend between the interior side 304 and the exterior side 306. A diaphragm 312 can span diaphragm opening 318. Diaphragm opening 318 can be configured so that diaphragm 312 can move within diaphragm opening 318. Diaphragm 312 can be connected to a piston 314. Piston 314 can take many shapes and forms. Here it is shown as puck shaped with an elongated portion that connects to diaphragm 312. A vent gasket 316 can be connected to piston 314. As illustrated, vent gasket 316 can be connected to the top of piston 314 and extend cantilevered across enclosure 302 and over vent 308.

In operation, when sealing mechanism 300 is introduced to an environment where the pressure exceeds a certain threshold, such as being placed under water, water can enter the vent 308 and diaphragm opening 318. Diaphragm 312 is not water or air permeable and thus neither water nor air pass into interior side 304 via diaphragm opening 318. At lower pressures, the membrane 310 also does not allow water to permeate to interior side 304. As the pressure increases, however, the ability of the membrane 310 to resist water, particularly when surfactants are present, degrades. Simultaneously though, the increased pressure exerts a force on the diaphragm, deflecting it. As illustrated in FIG. 1B, as diaphragm 312 deflects, piston 314 is pulled toward interior side 304. Once a threshold amount of pressure is applied, diaphragm 312 will deflect to the point that vent gasket 316 contacts enclosure 302 and effectively seals off vent 308. Increasing pressure increases the effectiveness of the seal created by vent gasket 316 over vent 308 since the diaphragm will continue to deflect and pull piston 314 toward the interior side 304. In addition, water pressure will build up on vent gasket 316 itself, since gasket 316 is also exposed to exterior side 306.

Figure 4A:
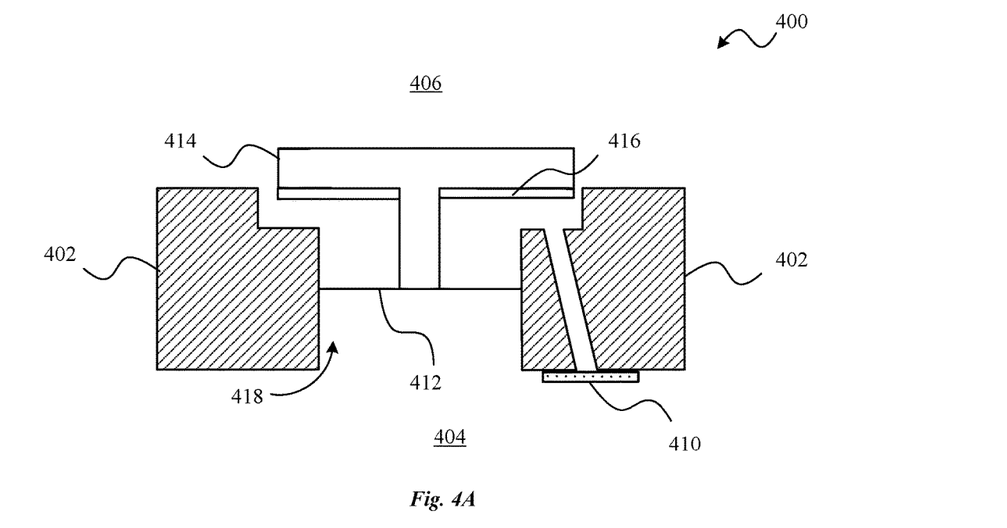
FIGS. 4A and 4B show a representation of an alternative embodiment of a sealing mechanism in accordance with the described embodiments.
Figure 4B:
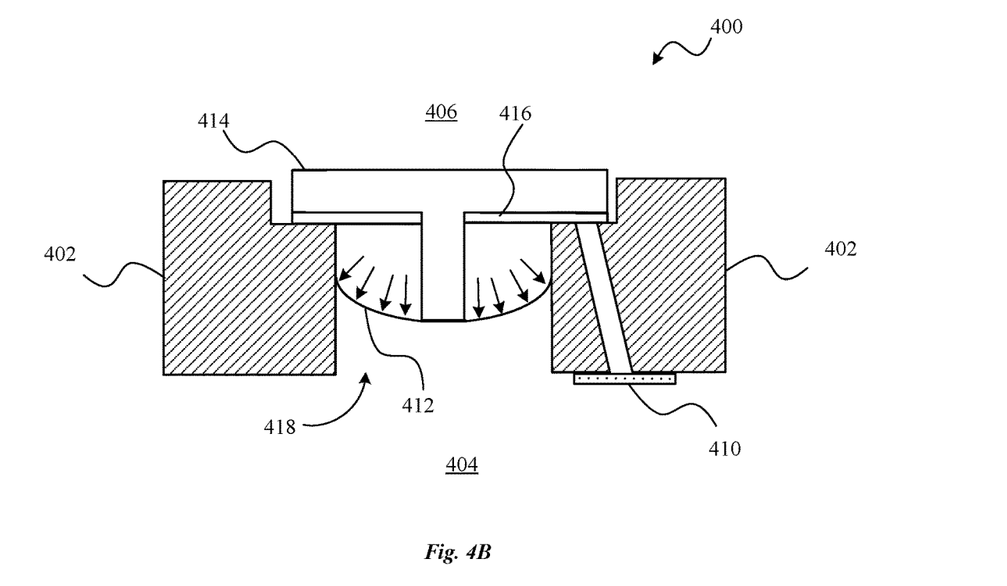

Sealing mechanism 300 can take various other forms, of which a select few are described in various embodiments below. FIGS. 4A and 4B show an alternative embodiment representation of sealing mechanism 400 in accordance with the described embodiments. Here the configuration of most components is similar to that illustrated in FIGS. 3A and 3B, except here vent 408 is configured to extend between the interior side 404 and the exterior side 406 as well as underneath the puck shaped portion of piston 414. Vent gasket 416 can be connected to the bottom side of piston 414 at the puck shaped portion of piston 414. When the pressure builds, exerting a force on diaphragm 412, piston 414 is pulled to seal off vent 408 with the vent gasket 416 being sandwiched between piston 414 and the enclosure 402. In this embodiment vent gasket 416 can additionally seal off diaphragm hole 418. This provides the advantage of when the pressure builds; greater and greater strain is not exerted on the diaphragm, which otherwise could possibly cause the diaphragm to fail. Instead, once piston 414 seals off vent 408 and diaphragm hole 418, increasing amounts of pressure will only be applied to the piston, maintaining piston 414 in the sealed state as illustrated in FIG. 4B.

Figure 5A:
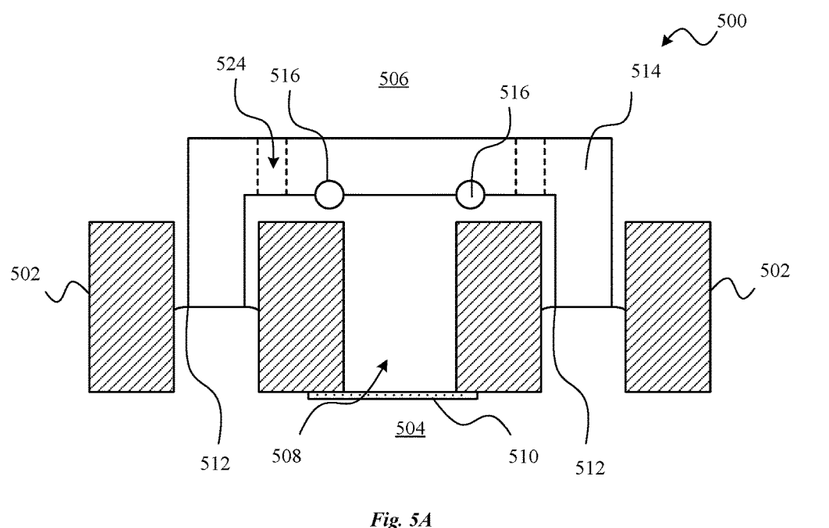
FIGS. 5A and 5B show a representation of an alternative embodiment of a sealing mechanism in accordance with the described embodiments.
Figure 5B:
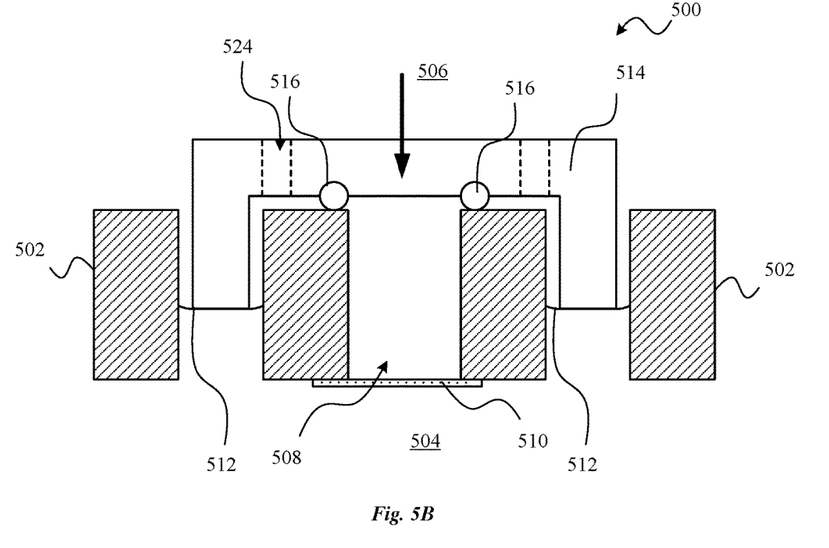

FIGS. 5A and 5B show an alternative embodiment representation of sealing mechanism 500 in accordance with the described embodiments. In this embodiment, sealing mechanism 500 is arranged between an exterior side 506 and interior side 504 and is similar to the embodiment shown in FIGS. 4A and 4B. Piston 514 is suspended by diaphragms 512, which connects to enclosure 502 on both sides of the diaphragms 512. The membrane 610 is connected to the bottom of piston 514, which spans vent 508. Openings 524 are located in piston 514 allowing water and air into the region where the membrane 510 resides.

Figure 6A:
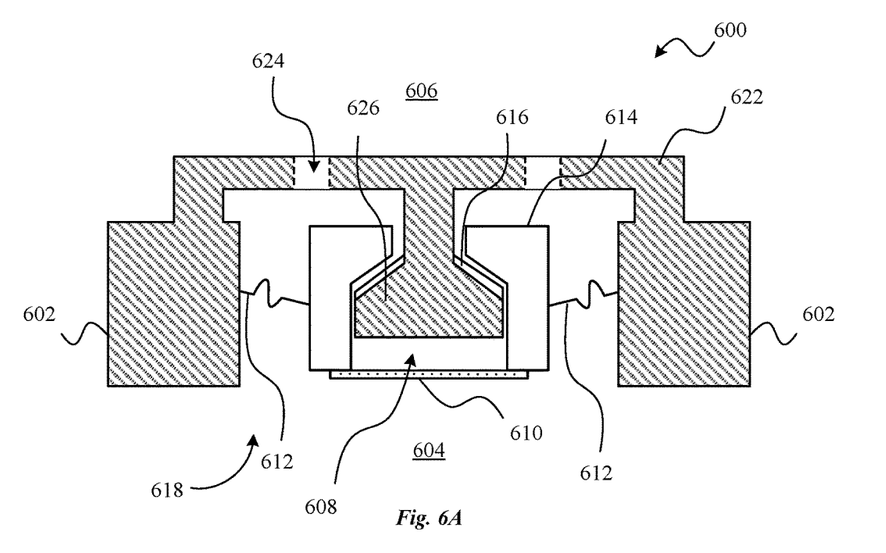
FIGS. 6A and 6B show a representation of an alternative embodiment of a sealing mechanism in accordance with the described embodiments.
Figure 6B:
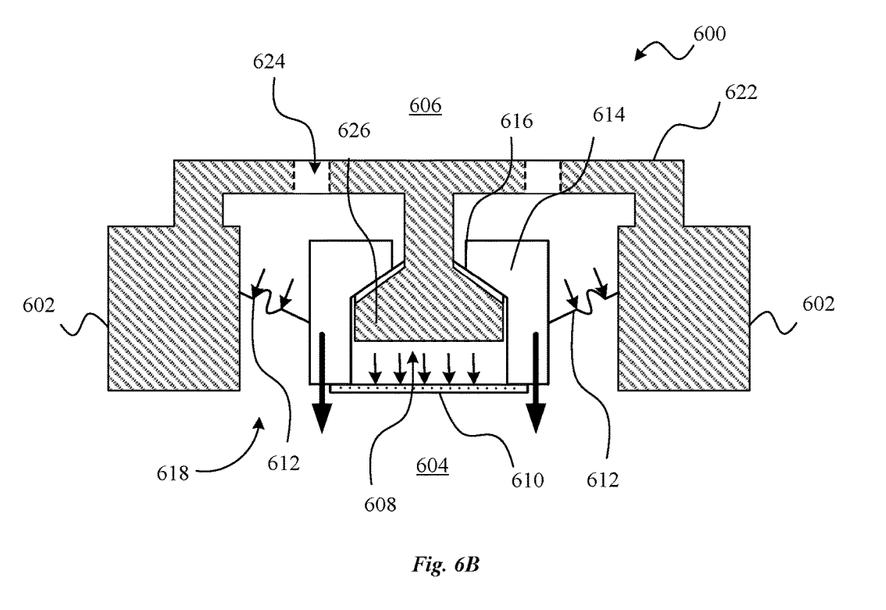

FIGS. 6A and 6B show an alternative embodiment representation of sealing mechanism 600 in accordance with the described embodiments. Here, piston 614 is configured so that it is suspended from enclosure 602 via diaphragm 612. Enclosure 602 has a cap portion 622 that bridges vent 608 and diaphragm hole 618. Cap portion 622 has one or more holes 624 that allow water and/or air to pass across enclosure 602 via cap portion 622 from exterior side 606 toward interior side 604, but not past diaphragm 612 or the membrane 610 given this configuration. As pressure builds in sealing mechanism 600, piston 614 is pushed toward interior side 604 by the deflection of diaphragm 612. Enclosure 602 has a plug portion 626 that is covered by vent gasket 616. The membrane 610 is arranged across an opening in the piston 614 below plug portion 626. As shown in FIG. 6B, when piston 614 moves toward interior side 604 and is pressed against vent gasket 616, the membrane 610 is sealed off from any further pressure build up due to increased pressure on exterior side 606. Diaphragm 612 is shown in a convoluted shape here, but on all described embodiments can take the form of a concave, convex, convoluted, linear or various other cross sectional patterns. The convoluted shape can lead to a designed response by the diaphragm that can be tuned to particular circumstances depending on the shape. This particular embodiment has the advantage that the enclosure 602 and the portions of sealing mechanism 600 which are exposed to exterior side 606, are static whereas the moving portions, such as piston 614 are internal to the enclosure 602 and otherwise not exposed to the exterior side 606.

Figure 7A:
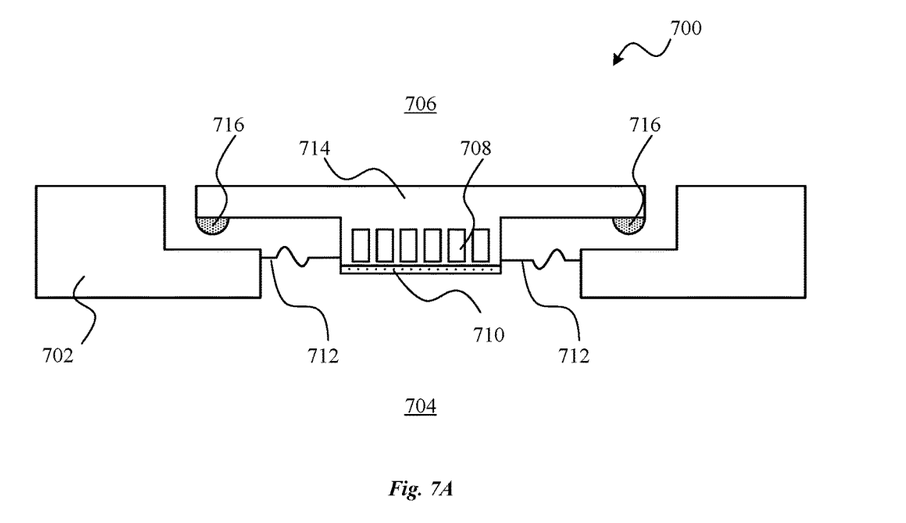
FIGS. 7A and 7B show a representation of an alternative embodiment of a sealing mechanism in accordance with the described embodiments.
Figure 7B:
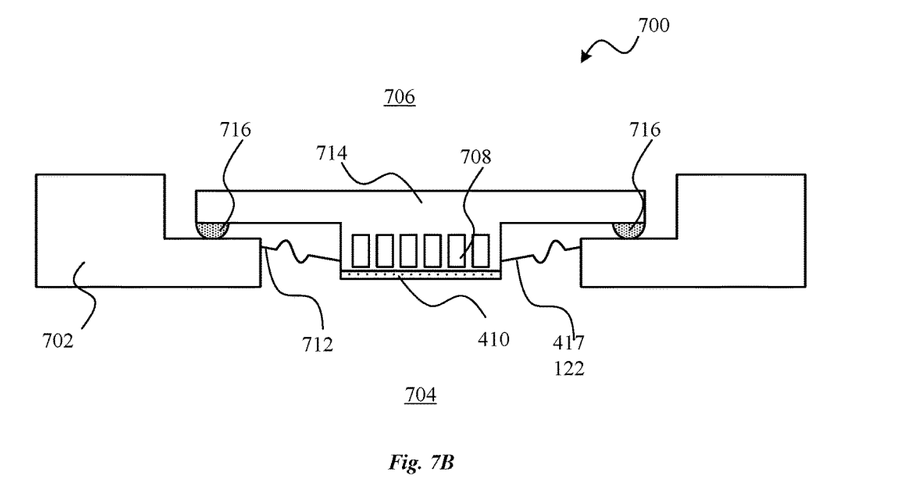

FIGS. 7A and 7B show an alternative embodiment representation of sealing mechanism 700 in accordance with the described embodiments. As seen, piston 714 has vent gaskets 716 connected to its underside and is suspended by diaphragms 712, which are also connected to enclosure 702. In this embodiment, vent 708 takes the form of several openings that are arranged in piston 714 forming a basket for water and/or air to enter and interact with the membrane 710. In this embodiment, like the one shown in FIGS. 4A and 4B, when the pressure seals off vent gasket 716 against enclosure 702, diaphragms 712 are also sealed off and additional pressure will not build up on either the membrane 710 or diaphragms 712.

Figure 8:
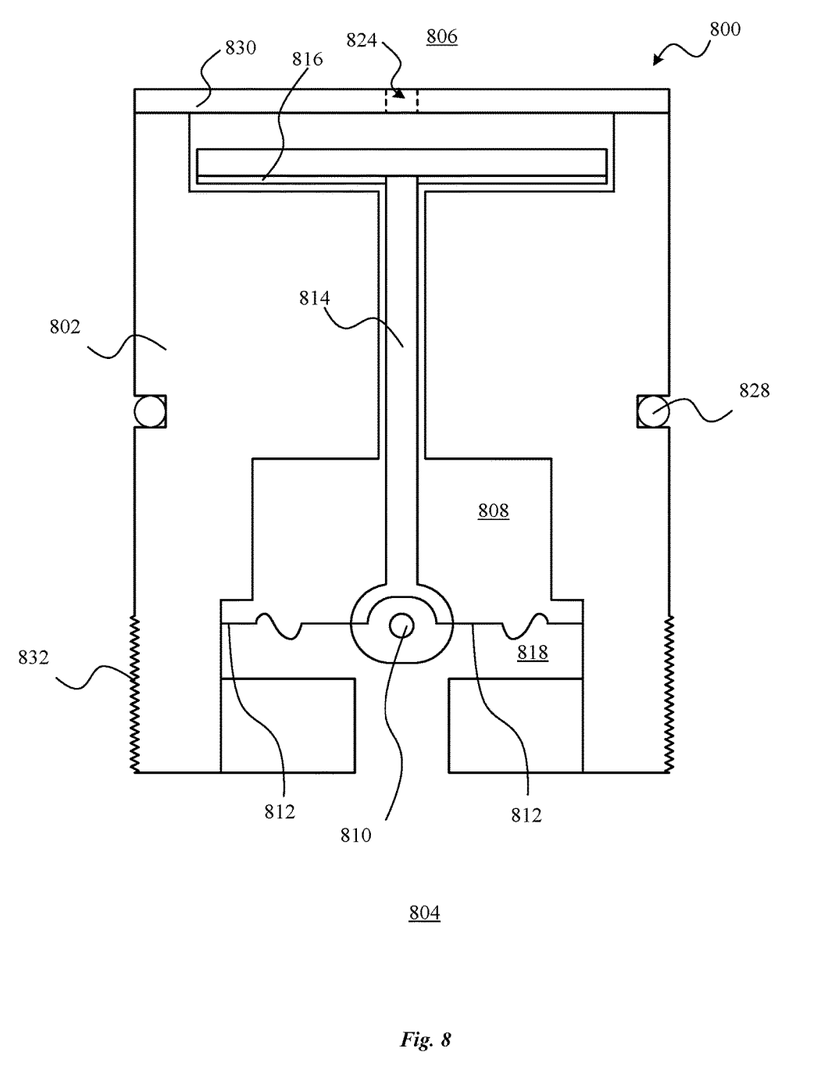
FIG. 8 shows a representation of an alternative embodiment of a sealing mechanism in accordance with the described embodiments.

FIG. 8 shows a cross sectional view an alternative embodiment representation of sealing mechanism 800 in accordance with the described embodiments. In this embodiment sealing mechanism 800 can be a modular system that can be assembled and then installed in the housing 12 or other component of an electronic device. In this embodiment enclosure 802 can have threads 832 along its exterior, either entirely along its length or partially, as shown. Threads 832 can coordinate with corresponding threads (not shown) in a hole in an electronic device housing 12. Piston 814 can be arranged in the interior of enclosure 802 and can extend from diaphragm hole 818, where the diaphragm 812 connects piston 814 to enclosure 802. Vent 808 extends from interior side 804 up along piston 814 toward exterior side 806. Piston 814 has a puck shaped portion with a vent gasket 816 connected to the underside of puck shaped portion. Piston 814 has a bulbous end opposite the puck shaped portion where the membrane 810 can be arranged. A cap 830 can be attached to the top of enclosure 802 and can have cap holes 824 for allowing air and water to flow through. An O-ring 828 can be arranged around the exterior of enclosure 802 so that when the modular sealing mechanism 800 is installed in an electronic device, water is only allowed to penetrate the intended areas of sealing mechanism 800 and not otherwise enter the interior of the electronic device (not shown).

Figure 9A:
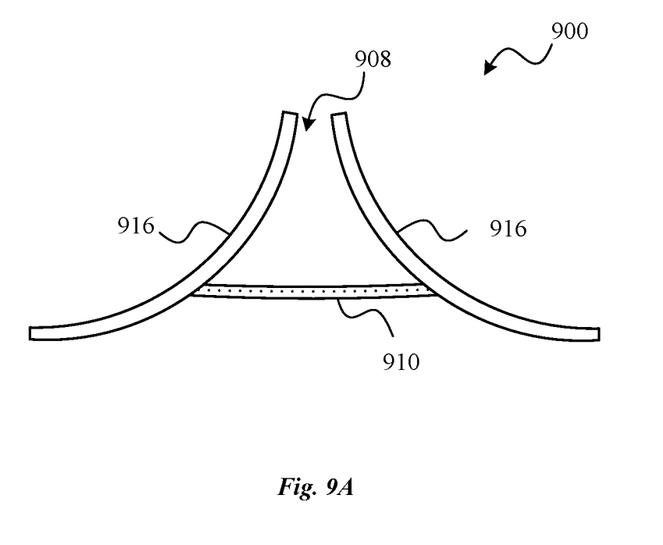
FIGS. 9A and 9B show a representation of an alternative embodiment of a sealing mechanism in accordance with the described embodiments.
Figure 9B:
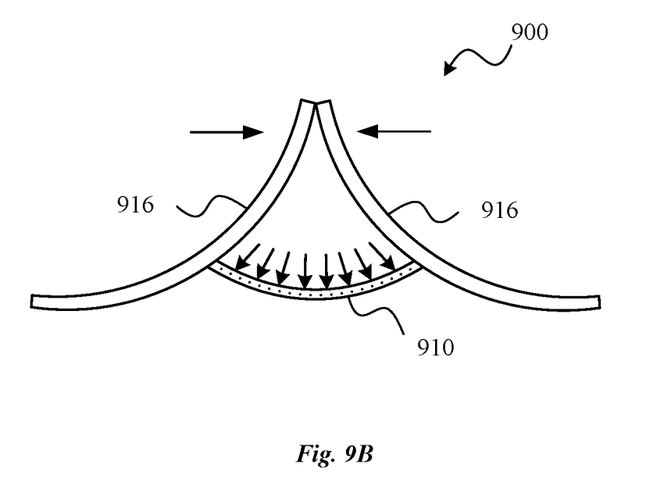

FIGS. 9A and 9b show an alternative embodiment representation of sealing mechanism 900 in accordance with the described embodiments. In this embodiment, two curved vent gaskets 916 can be arranged to form a vent 908. The vent gaskets 916 can take the form of flexible flaps and can be made of rubber or plastic among other flexible materials. The vent gaskets 916 can be attached to each other by a membrane 910. Here the membrane 910 can be an integrated with the diaphragm, one embodiment of which is described and shown further below with regard to FIG. 10. Like in other embodiments, as pressure builds up on an exterior side 906, the membrane 910, given that is integrated with the diaphragm, deflects inward toward interior side 904. Given the configuration of the membrane 910 and how it is connected to vent gaskets 916, vent gaskets are drawn toward the interior side 904 and toward each other. Once vent gaskets 916 mate, they form a seal preventing additional water intrusion and/or pressure build up on the membrane 910, as illustrated in FIG. 9B. This embodiment has the advantage of having fewer components by not needing a piston for example and by integrating the diaphragm into the integrated diaphragm the membrane.

Figure 10:
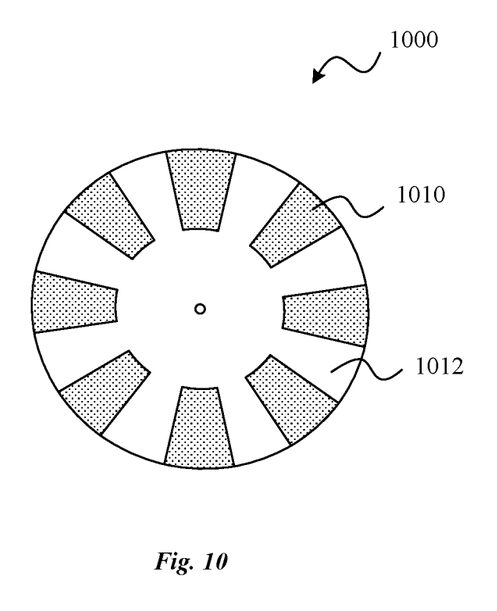
FIG. 10 shows a representation of an integrated diaphragm and air permeable water-resistant membrane in accordance with the described embodiments.

FIG. 10 shows an integrated diaphragm/membrane 1000 in accordance with various described embodiments. In this particular embodiment, integrated diaphragm/membrane 1000 can be circular and include the membrane portions 1010. It can also include diaphragm portions 1012 between the membrane portions 1010. The membrane portions 1010 can take various other shapes including square, rectangular, triangular amongst other various shapes. The membrane portions 1010 can be symmetrically radially arranged around integrated diaphragm/membrane 1000 and. The membrane portions 1010 can also be configured in numerous other patterns and arrangements that make integrated diaphragm/membrane 1000 easier to manufacture. Integrated diaphragm/membrane 1000 can be used in any of the embodiments contemplated herein where it is beneficial to integrate the diaphragm with the membrane.

Figure 11:
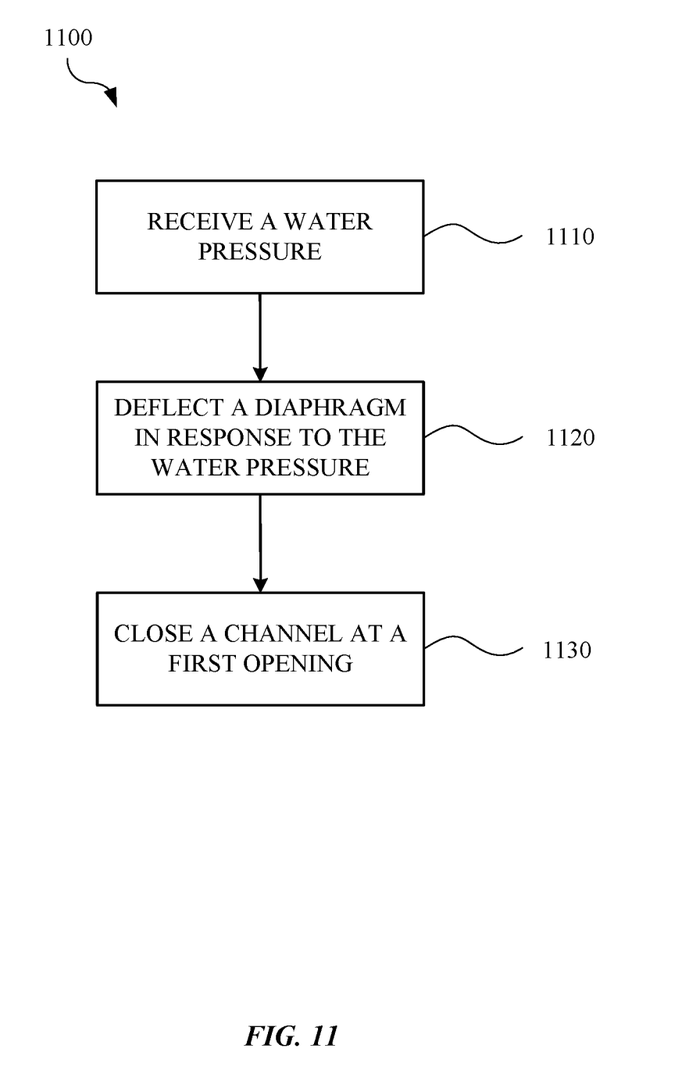
FIG. 11 is a flow chart of a method performed by a sealing mechanism for sealing off an interior of a housing in accordance with the described embodiments; and, FIG. 12 is a block diagram of an electronic device suitable for use with the described embodiments.

FIG. 11 shows a flow chart for a method 1100 preformed by a sealing mechanism in accordance with the described embodiments. In a first step 1110, the sealing mechanism as provided in the described embodiments can receive a water pressure at the first surface of the stopper mechanism. In a second step 1120, the sealing mechanism can deflect the diaphragm in response to the water pressure received at the first surface. In a third step 1130 the sealing mechanism can close a channel at the first opening in accordance with the deflection of the diaphragm, maintaining a pressure at the membrane of less than the pressure threshold.

Figure 12:
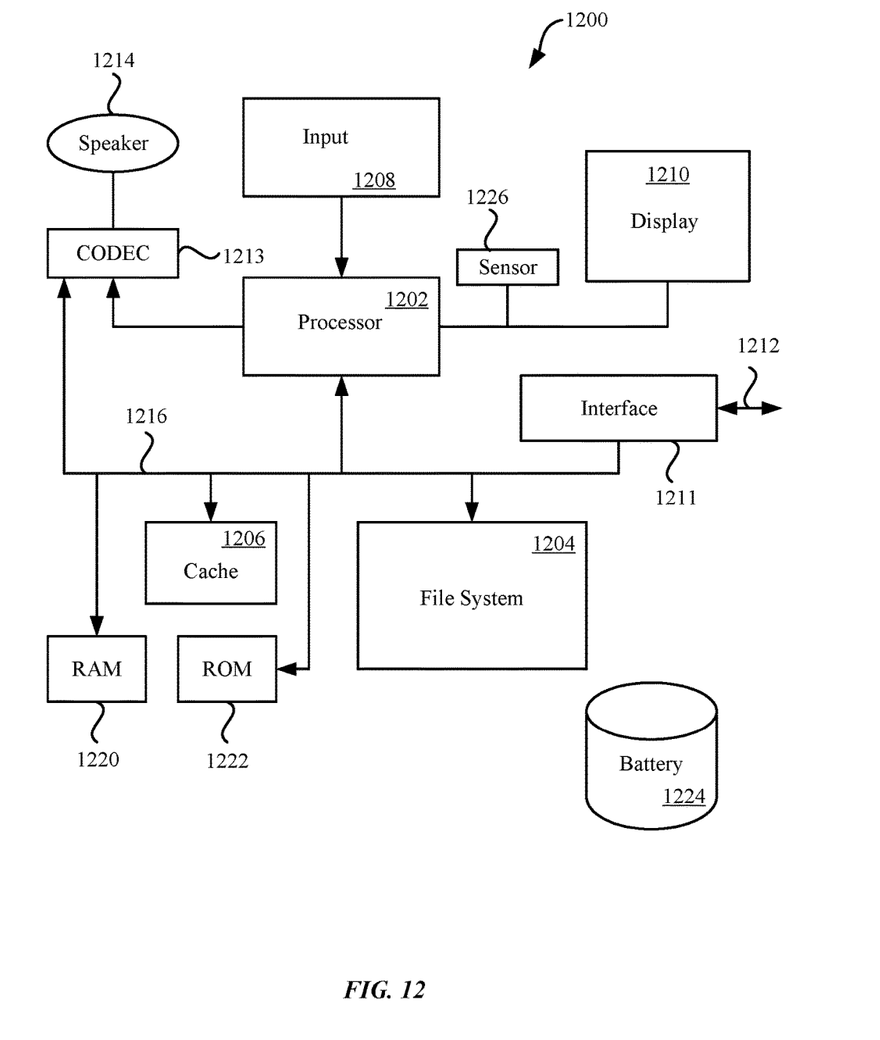

FIG. 12 is a block diagram of an electronic device 1200 suitable for use with the described embodiments. The electronic device 1200 illustrates circuitry of a representative computing device. The electronic device 1200 includes a processor 1202 that pertains to a microprocessor or controller for controlling the overall operation of the electronic device 1200. The electronic device 1200 stores media data pertaining to media items in a file system 1204 and a cache 1206. The file system 1204 is, typically, a semiconductor memory, cloud storage, or storage disks or hard drives. The file system 1204 typically provides high capacity storage capability for the electronic device 1200. However, since the access time to the file system 1004 is relatively slow, the electronic device 1200 can also include a cache 1206. The cache 1206 is, for example, Random-Access Memory (RAM) provided by semiconductor memory. The relative access time to the cache 1206 is substantially shorter than for the file system 1204. However, the cache 1206 does not have the large storage capacity of the file system 1204. Further, the file system 1204, when active, consumes more power than does the cache 1206. The power consumption is often a concern when the electronic device 1200 is a portable media device that is powered by a battery 1224. The electronic device 1200 can also include a RAM 1220 and a Read-Only Memory (ROM) 1222. The ROM 1222 can store programs, utilities or processes to be executed in a non-volatile manner. The RAM 1220 provides volatile data storage, such as for the cache 1206.

The electronic device 1200 also includes a user input device 1208 that allows a user of the electronic device 1200 to interact with the electronic device 1200. For example, the user input device 1208 can take a variety of forms, such as a button, keypad, dial, touch screen, audio input interface, visual/image capture input interface, input in the form of sensor data, etc. Still further, the electronic device 1200 includes a display 1210 (screen display) that can be controlled by the processor 1202 to display information to the user. A data bus 1216 can facilitate data transfer between at least the file system 1204, the cache 1206, the processor 1202, and the CODEC 1213.

In one embodiment, the electronic device 1200 serves to store a plurality of media items (e.g., songs, podcasts, etc.) in the file system 1204. When a user desires to have the electronic device play a particular media item, a list of available media items is displayed on the display 1210. Then, using the user input device 1208, a user can select one of the available media items. The processor 1202, upon receiving a selection of a particular media item, supplies the media data (e.g., audio file) for the particular media item to a coder/decoder (CODEC) 1213. The CODEC 1213 then produces analog output signals for a speaker 1214. The speaker 1214 can be a speaker internal to the electronic device 1200 or external to the electronic device 1200. For example, headphones or earphones that connect to the electronic device 1200 would be considered an external speaker.

The electronic device 1200 also includes a network/bus 1211 that couples to a data link 1212. The data link 1212 allows the electronic device 1200 to couple to a host computer or to accessory devices. The data link 1212 can be provided over a wired connection or a wireless connection. In the case of a wireless connection, the network/bus interface 1211 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 1226 can take the form of circuitry for detecting any number of stimuli. For example, sensor 1226 can include a Hall Effect sensor responsive to external magnetic field, an audio sensor, a light sensor such as a photometer, and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   a housing having walls that define an interior volume, the housing further defining:
   a first opening, and
   a second opening that leads to the interior volume;
   a sealing mechanism arranged to prevent ingress of a liquid into the interior volume, the sealing mechanism comprising:
   a membrane that covers the second opening, the membrane being air permeable and liquid resistant such that the membrane (i) allows air to pass and (ii) prevents passage of the liquid up to a predetermined liquid pressure threshold;
   a stopper mechanism at least partially positioned in the first opening; and
   a diaphragm coupled to the stopper mechanism, wherein a deflection of the diaphragm by the liquid causes the stopper mechanism to (i) move and seal off the second opening and prevent the liquid at the membrane from exceeding the predetermined liquid pressure threshold, and (ii) seal off the diaphragm from an external environment that is outside the housing.

2. The electronic device of claim 1, wherein the stopper mechanism comprises a piston having a piston head and a gasket, the piston being coupled to the diaphragm, the gasket being arranged to a top side of the piston.

3. The electronic device of claim 1, wherein the stopper mechanism comprises a piston having a piston head and a gasket, the piston being coupled to the diaphragm and the gasket being arranged to a bottom side of the piston head, and wherein the second opening is inclined such that the second opening is below the gasket.

4. The electronic device of claim 1, wherein the membrane is integrated into the diaphragm.

5. The electronic device of claim 1, wherein the diaphragm biases the stopper mechanism away from the first opening and the second opening when pressure of the liquid drops below a lower threshold.

6. The electronic device of claim 1, wherein the membrane is made from expanded polytetrafluoroethylene "ePTFE".

7. The electronic device of claim 1, wherein the diaphragm is convoluted.

8. The electronic device of claim 1, further comprising:
   a display carried by the housing;
   a first band feature coupled to the housing; and
   a second band feature coupled to the housing, the second band feature capable of securing with the first band feature to secure the housing with an appendage of a user.

9. The electronic device of claim 1, wherein the sealing mechanism is modular.

10. A method performed by a sealing mechanism for preventing ingress of liquid into an interior volume of a housing, the housing having a first opening at an external environment and a second opening that leads to the interior volume, wherein the sealing mechanism comprises:
    a membrane that covers the second opening, the membrane being air permeable and liquid resistant up to a pressure threshold such that the membrane allows air to pass and prevents passage of water;
    a stopper mechanism at least partially positioned in the first opening; and
    a diaphragm that is air and water impermeable and coupled to the stopper mechanism, the method comprising:
    receiving a liquid at a surface of the diaphragm and the membrane;
    deflecting the diaphragm in response to the liquid received; and
    closing, by the stopper mechanism, the second opening in accordance with the diaphragm deflecting and sealing off the diaphragm from the external environment, wherein a pressure from the liquid at the membrane is maintained less than the pressure threshold based on the stopper mechanism closing the second opening.

11. The method of claim 10, wherein the stopper mechanism comprises a cantilevered gasket that extends over the first opening.

12. The method of claim 10, wherein the stopper mechanism comprises a piston having a piston head and a gasket, the piston being coupled to the diaphragm and the gasket being arranged to a bottom side of the piston head, and wherein the first opening is arranged below the gasket.

13. The method of claim 10, wherein the membrane is integrated into the diaphragm.

14. The method of claim 13, wherein the diaphragm is arranged in the first opening.

15. The method of claim 10, wherein the diaphragm actuates the stopper mechanism away from the first opening and the second opening when the pressure of the liquid drops below the pressure threshold.

16. The method of claim 10, wherein the membrane is made from expanded polytetrafluoroethylene "ePTFE".

17. The method of claim 10 wherein the diaphragm is convoluted.

18. The method of claim 10, wherein the sealing mechanism is modular.

\* \* \* \* \*